United States Patent
Parsons et al.

(10) Patent No.: US 7,154,256 B2
(45) Date of Patent: Dec. 26, 2006

(54) INTEGRATED VI PROBE

(75) Inventors: Richard Parsons, Phoenix, AZ (US);
Robert Jackson, Gilbert, AZ (US);
Deana R. Delp, Tempe, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/504,159

(22) PCT Filed: Feb. 27, 2003

(86) PCT No.: PCT/US03/05048

§ 371 (c)(1),
(2), (4) Date: Mar. 18, 2005

(87) PCT Pub. No.: WO03/075300

PCT Pub. Date: Sep. 12, 2003

(65) Prior Publication Data

US 2005/0184668 A1    Aug. 25, 2005

Related U.S. Application Data

(60) Provisional application No. 60/360,016, filed on Feb. 28, 2002.

(51) Int. Cl.
*G01R 31/02* (2006.01)
(52) U.S. Cl. ........................ 324/72; 324/72.5; 324/713
(58) Field of Classification Search .................. 324/72, 324/72.5, 713
See application file for complete search history.

(56) References Cited

U.S. PATENT DOCUMENTS

| 5,339,039 | A | 8/1994 | Carlile et al. |
| 5,565,737 | A | 10/1996 | Keane |
| 5,703,488 | A | 12/1997 | Ohmi et al. |
| 5,770,922 | A | 6/1998 | Gerrish et al. |
| 2004/0021454 | A1* | 2/2004 | Jevtic et al. ............... 324/72.5 |

* cited by examiner

*Primary Examiner*—David Vu
(74) *Attorney, Agent, or Firm*—Oblon, Spivak, McClelland, Maier & Neustadt, P.C.

(57) ABSTRACT

Integrated voltage and current (VI) probe (18) for integration inside a transmission line (17) having inner (3) and an outer (4) conductors. Current probes, often implemented as loop antennas, can be coupled to the outer conductor. The probes can either be built onto the same panel or on different panels.

19 Claims, 4 Drawing Sheets

INTEGRATED VI PROBE

CROSS REFERENCES TO RELATED APPLICATIONS

The present application claims priority and is related to U.S. provisional Ser. No. 60/360,016, filed on Feb. 28, 2002. The present application is related to U.S. provisional application Ser. No. 60/259,862, entitled "Capacitively coupled RF voltage probe", filed on Jan. 8, 2001; and co-pending application 60/359,986, entitled "Portable VI probe," filed on Feb. 28, 2002. The contents of all of those applications are incorporated herein by reference in their entirety.

BACKGROUND OF THE INVENTION

1. Field of the Invention

This invention is directed to a method and a system for measuring voltage and current levels using an Integrated (i.e. in-line) Voltage and Current (VI) Probe.

2. Discussion of the Background

In the fabrication and processing of semi-conductor wafers, such as silicon wafers, a variety of different semi-conductor equipment and processes can be utilized. For example, wafer processing techniques are known in the art and may include, for example, photolithography, ion beam deposition, vapor deposition, etching, as well as a variety of other processes.

In one method of wafer processing, plasma generators are used to process a wafer, for example by etching a layer formed on the surface of the wafer. In employing this technique, electrical power is coupled to the plasma generator from an electrical source. Typically, the electrical energy has a frequency in the radio frequency (RF) range. Control of the process is performed in part by measuring and monitoring the RF signal. The power input into the system can be determined by measuring the RF voltage (V) and the current (I) components of the RF power source coupled to the plasma generator. Thus, a common practice for measuring RF power is to install a sensor for monitoring current and voltage in series with the transmission medium coupling the RF power to the plasma generator.

Sometimes, however, the presence of the RF probes can itself disrupt the propagating electro-magnetic fields the probes are intended to measure. This may occur through reflections of the RF signal, for example, that are imposed by the implementation of the RF probe(s). Consequently, there exists a need for an integrated voltage and current probe to monitor a source of RF electrical power which minimally intrudes in the RF transmission line in which the probes are placed.

Moreover, the presence of RF probes can affect proven processes, which is entirely unacceptable to device manufacturers. As the probes are installed in the RF transmission structure outside the chamber and sometimes beyond the output of the match network, the above-identified problem can be further exacerbated when commercially available probes are utilized. Therefore, there exists a need for an integrated voltage and current probe to monitor a source of RF electrical power, which minimally affects a proven process.

SUMMARY OF THE INVENTION

A need exists for a voltage and or current probe which can be installed along a transmission line in a plasma generator and which will minimally perturb or impact the propagating electro-magnetic fields or the plasma process.

Therefore, an exemplary embodiment of this invention provides for an apparatus and a system for integrating the apparatus into a transmission line of a plasma generator. The apparatus can detect voltage and/or current within a transmission line while minimally impacting or perturbing the propagating electro-magnetic fields. This minimal impact arises from the voltage and current probes being placed within the existing chamber structure proximate the power coupling (or plasma) electrode.

Other objects, features and advantages of the present invention will become apparent from the following detailed description, the accompanying drawings, and the appended claims.

BRIEF DESCRIPTION OF THE DRAWINGS

A more complete appreciation of the invention and many of the attendant advantages thereof will become readily apparent with reference to the following detailed description particularly when considered in conjunction with the accompanied drawings, in which.

DETAILED DESCRIPTION OF THE INVENTION

Figure 1A:
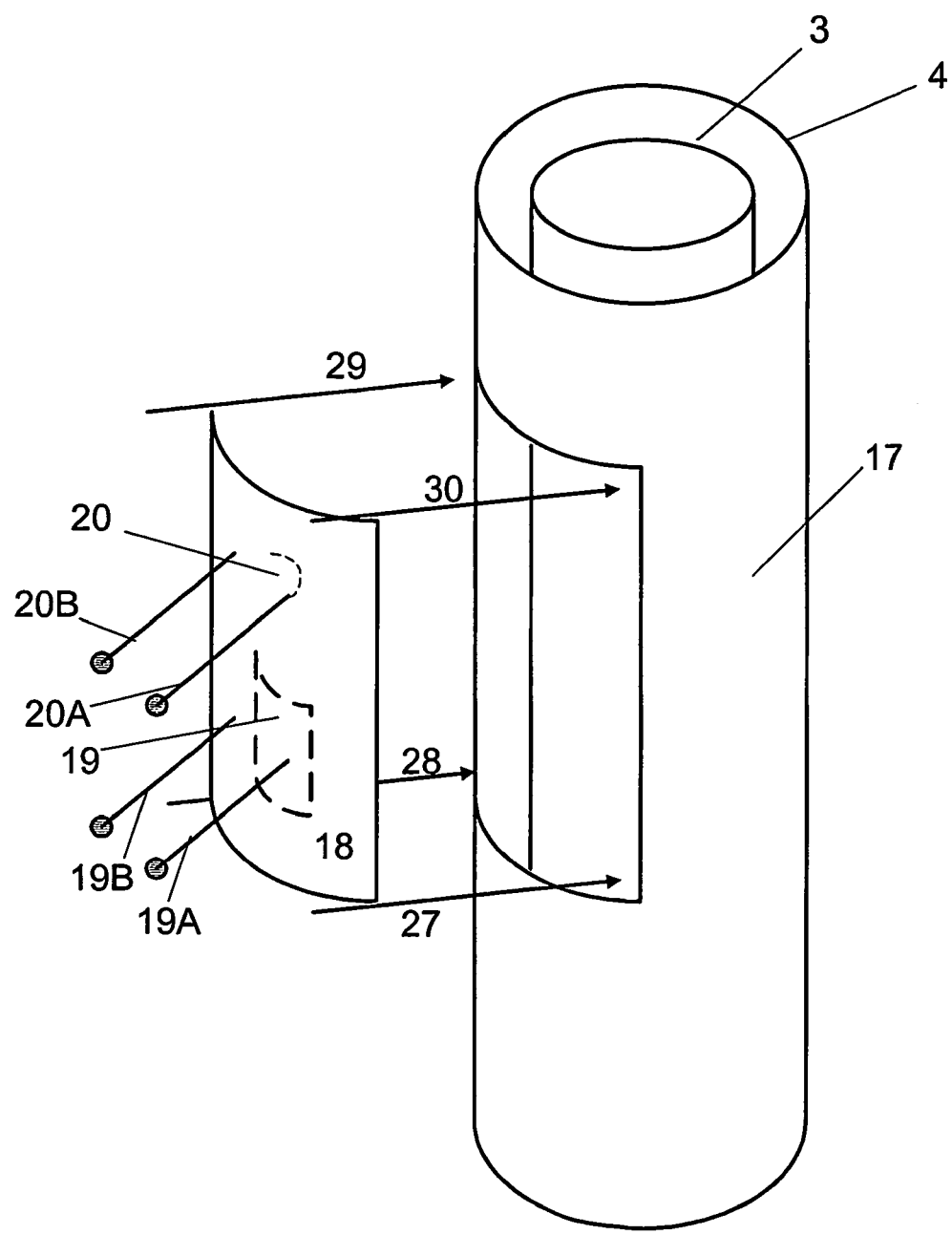
FIG. 1A is a perspective view of a voltage probe integrated into a transmission line.

Referring to FIG. 1A, a transmission line 17 includes an inner conductor 3 and an outer conductor 4. Each runs along the transmission line in an axial direction such that the inner conductor has a diameter substantially smaller than that of the outer conductor.

A non-limiting embodiment of an integrated VI probe 18 is shown broken away from the outer conductor of the transmission line. For example, the integrated VI probe can be attached, for example, as a panel, to the outer conductor 4 as shown by arrows 30A, 30B, 30C and 30D. Arrows 30A, 30B, 30C and 30D can, for example, represent fasteners (e.g., bolts, solder, adhesive) utilized to affix the VI probe panel 18 to a windowed section of the outer conductor 4 of RF transmission line 17, wherein the VI probe panel 18 serves as the outer conductor.

When attached, the VI probe panel 18 should be within the transmission line, as shown in FIGS. 1A through 4, proximate to the plasma processing electrode in a space sufficiently large to accommodate the size of the probe. Typically, the latitudinal and longitudinal dimensions of the probe are on the order of one centimeter and the thickness is on the order of a millimeter. Once installed, the probe should not alter the geometric configuration of the transmission line or the material properties of the conductors. Thus, the intrinsic impedance of the transmission line is to remain substantially constant or constant.

Voltage and current probes 19 and 20, respectively, with electrical leads 19A, 19B, 20A and 20B can mounted upon the VI probe panel 18 using techniques conventional in the art. For example, in a plasma processing environment, lead 19A can be directly coupled to the capacitively coupled electrode and lead 19B can be coupled to the outer conductor 4 of RF transmission line 17. Alternatively, the pair of leads 19A, 19B can be replaced with a standard electrical connector such as, for example, a SMA connector or a BNC connector. For example, lead 20A can be coupled to the loop antenna and lead 20B can be coupled to the outer conductor 4 of RF transmission line 17. Alternatively, the pair of leads 20A, 20B can be replaced with a standard electrical connector such as, for example, a SMA connector or a BNC connector. The construction and calibration of VI probes are well known to those skilled in the art of voltage-current diagnostics. For example, VI probe construction and calibration is described in detail in pending U.S. application Ser. No. 60/259,862 filed on Jan. 8, 2001, and U.S. Pat. No. 5,467,013 issued to Sematech, Inc. on Nov. 14, 1995; each of which is incorporated herein by reference in its entirety.

In FIG. 1A, voltage and current probes, 19 and 20, respectively are shown mounted to a single VI probe panel 18. Alternatively, each probe can be mounted to separate panels, for example, a pair of VI probe panels can be oriented on diametrically opposing sides of RF transmission line 17, to which a voltage probe is fabricated on a first panel and a current probe is fabricated on a second, opposing panel. Desirably, transmission line 17 is mounted within a process chamber (not shown).

Figure 1B:
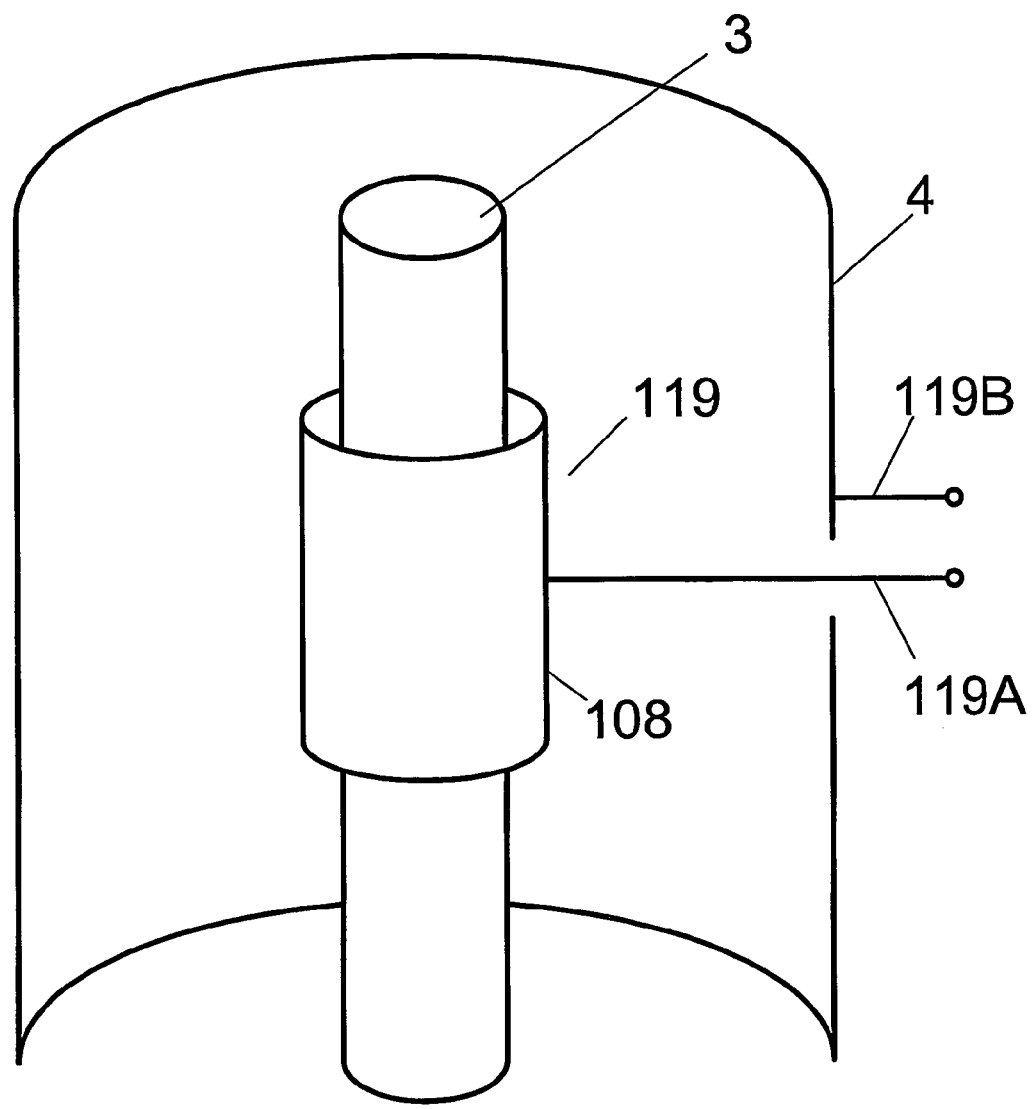
FIG. 1B is a perspective view of a voltage probe integrated into an inner conductor of a transmission line.

FIG. 1B shows the same voltage probe discussed above integrated onto an inner conductor 3 of a transmission line. Voltage probe 119 comprises electrical leads 119A and 119B, wherein lead 119A is coupled to voltage probe electrode 108 or an electrode ring and exits the transmission line through outer conductor 4. Voltage probe electrode 108 can be a ring electrode as shown in FIG. 1B, or alternatively, can comprises a plate electrode in close proximity to the inner conductor.

Figure 2:
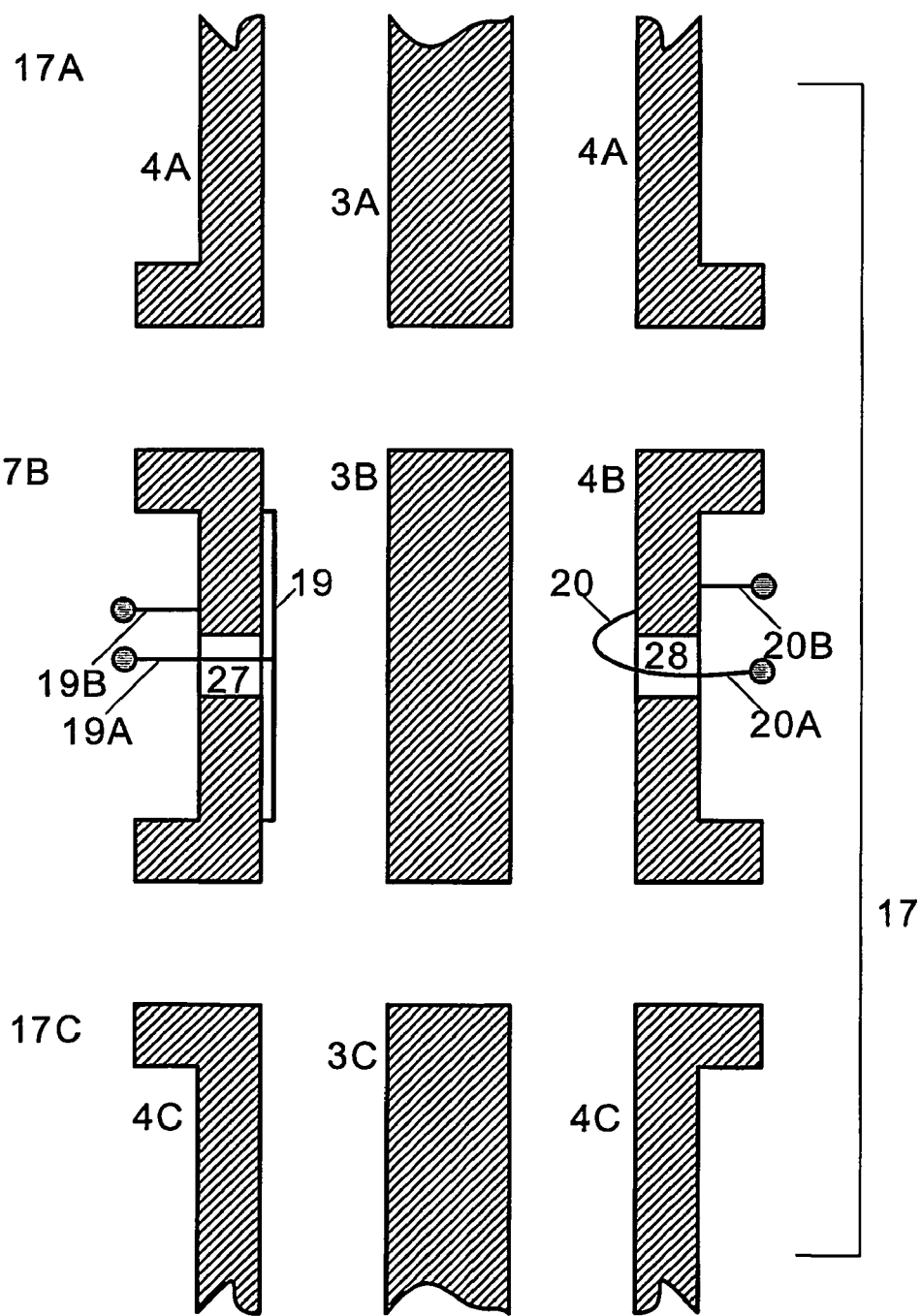
FIG. 2 is a side view of the various sections of the invention showing the integration of the voltage probe and the current probe.

FIG. 2 represents an alternate embodiment of an implementation of a VI probe in a RF transmission line 17. The RF transmission line 17 includes various sections including sections 17A, 17B and 17C as shown. Section 17A can represent the output transmission line of an impedance match network, section 17C can represent the input transmission line to a plasma reactor, and section 17B can represent a transmission line section within which a voltage and current probe are mounted. Section 17B can be, for example, mounted between sections 17A and 17C using standard flanges (e.g., CF flanges, KF flanges) and the characteristic impedance of the overall transmission line (sections 17A, 17B and 17C) can be preserved. Desirably, sections 17B and 17C are mounted within the chamber.

Outer conductor 4B is the area on the transmission line 17 in which the probes have been installed. The outer conductor 4B contains access areas 27, 28 through which the probes attach to and exit from the outer conductor. The outer conductor 4B surrounds its corresponding part of the inner conductor 3B. In the illustrated embodiment, the various elements of the voltage and current probe are attached to the inner surface of the outer conductor. The voltage and current probes comprise similar elements as described with reference to FIG. 1. The voltage probe comprises a voltage probe electrode 19 that is connected to first and second leads 19A and 19B. At least one of the leads 19A and 19B is connected to one of the conductors (e.g., the outer conductor 4B) and acts as a ground reference. The pair of leads 19A, 19B, however, can be replaced with a standard electrical connector such as, for example, a SMA connector or a BNC connector. The current probe comprises a loop antenna 20 to which a lead 20A is coupled. A second lead 20B is coupled to the outer conductor 4B. The pair of leads 20A, 20B can be replaced with a standard electrical connector such as, for example, a SMA connector or a BNC connector. The VI probe construction and calibration is performed in a manner equivalent to the VI probe of FIG. 1A and described in detail in pending U.S. application Ser. No. 60/259,862 filed on Jan. 8, 2001, and U.S. Pat. No. 5,467,013 issued to Sematech, Inc. on Nov. 14, 1995.

Figure 3:
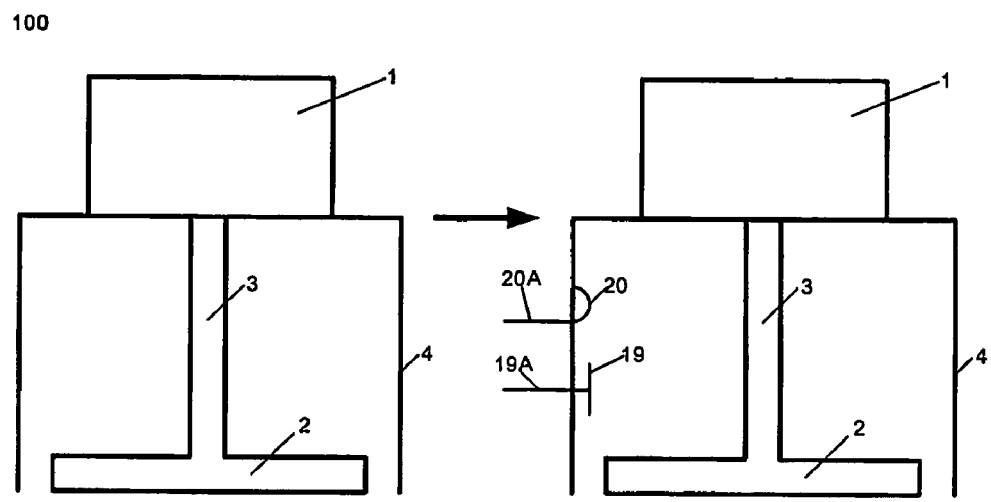
FIG. 3 is a schematic view of the voltage and current probe constructed within an upper electrode structure.

An Integrated VI probe can be built onto a transmission line within a plasma reactor. In a first embodiment, as shown in FIG. 3, a plasma generator 100 includes a plasma processing electrode 2, a match network 1, and a "transmission line" formed of (1) a conductor (acting as an inner conductor 3) between the electrode 2 and the match network 1 and (2) an electrode housing (acting as an outer conductor 4). An exemplary plasma reactor comprising a plasma processing electrode, to which RF power is applied, is described in U.S. Pat. No. 5,900,103 issued to Tokyo Electron Ltd. on May 4, 1999, which is incorporated herein by reference in its entirety. A match network 1 is employed to optimize the transfer of power from a RF source to plasma through a plasma processing electrode 2 by matching the output impedance of the RF source to the load impedance which includes the plasma. In general, an impedance match is obtained when the output impedance of the match network 1 is the complex conjugate of the load impedance. The interesting feature is that the characteristic impedance of the structure following the output of the match network 1 and including the plasma is not generally 50 Ohms. In fact, this impedance is usually very small. Therefore, when a VI probe is arranged within the electrode structure as shown in FIG. 3, it maximally complies with the designed characteristic impedance of the system and, hence, it minimally perturbs the propagating electro-magnetic fields. Such a system design can minimize any impact on the proven process in the plasma processing system while providing reliable measurement of the RF voltage and current.

FIG. 3 also shows a schematic view of the connection between the probes and the outer conductor that are analogous the structures shown in FIGS. 1A, 1B and 2. In FIG. 3, the voltage probe 19 and the current probe 20 are attached to the outer conductor in such a way as to be substantially close to one another. Alternately, they can be mounted on opposite sides of the outer conductor. In general, a voltage probe measures a voltage between a capacitively couple plasma electrode and a grounded housing. Similarly, the current probe 20 can be implemented as a loop antenna that captures at least a fraction of the azimuthal magnetic flux from the "transmission line".

The voltage probe 5 and the current probe 6 are installed onto the inner surface of the outer conductor. As described above, the construction and calibration of the voltage and current probes are described in detail in pending U.S. application Ser. No. 60/259,862 filed on Jan. 8, 2001, and U.S. Pat. No. 5,467,013 issued to Sematech, Inc. on Nov. 14, 1995.

Figure 4:
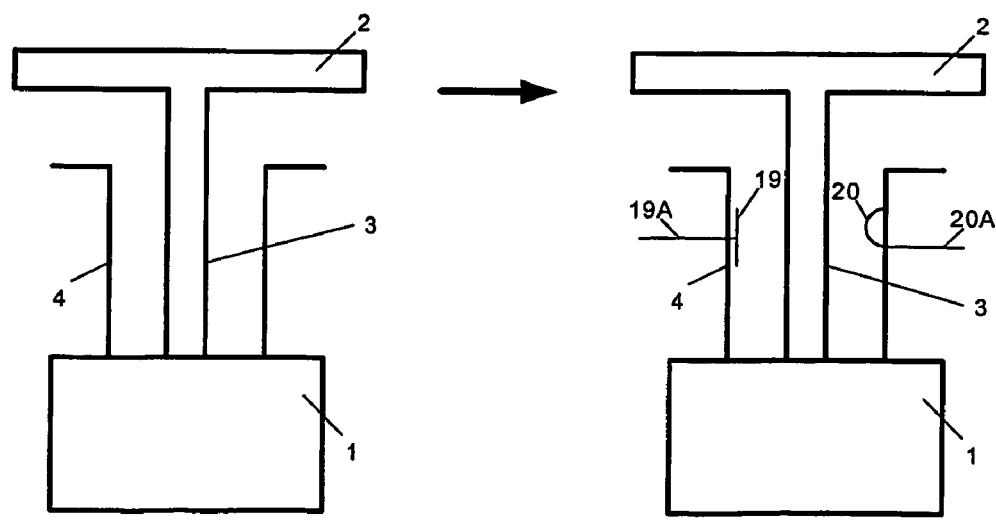
FIG. 4 is a schematic view of the voltage and current probe constructed within a lower electrode structure.

As shown in FIG. 4, a similarly effective result can be accomplished by having the voltage probe 19 and the current probe 20 installed onto the lower electrode structure. Here, FIG. 4 presents a second embodiment of an Integrated VI probe built into a "transmission line" for a lower electrode 2 of a plasma generator using structures analogous to those shown in FIGS. 1 and 2. In FIG. 4, the voltage probe 19 and the current probe 20 are built into the RF path between the lower electrode 2 and the match network 1. The probes can be mounted on opposite sides of the outer conductor as shown, on the same side, or on adjacent sides. As discussed above, the implementation of voltage and current probes using the structures described in FIGS. 1 and 2, and shown in FIG. 4, can be expected to minimally perturb the propagating electro-magnetic fields by not introducing (1) substantive changes in the characteristic impedance of the RF transmission line and, hence, (2) additional reflections. Therefore, such probes will reduce any impact on proven process in the plasma processing system.

At least one detector can be coupled to each probe in order to detect a voltage and/or current being transmitted on the transmission line to which the probes are connected. Such a detector can be an oscilloscope or an A/D device coupled to a computer to provide the voltage and/or current to the computer in periodic samples.

As would be understood by one of ordinary skill in the art, the voltage and current probes may be integrated into a transmission line separately. Thus, a current probe may be used without a voltage probe and vice versa.

Numerous modifications and variations of the present invention are possible in light of the above teachings. It is therefore to be understood that, within the scope of the appended claims, the invention may be practiced otherwise than as specifically described herein.

The invention claimed is:

1. An integrated voltage probe, for integration inside a transmission line between a capacitively coupled plasma processing electrode and a power source, the probe comprising:
   a voltage probe electrode integrated into the transmission line;
   first and second electrical leads connected to the voltage probe electrode; and
   a first window for passing the first and second electrical leads inside the transmission line to the voltage probe electrode.

2. The integrated voltage probe according to claim 1, wherein the first electrical lead of the voltage probe is coupled to the capacitively coupled plasma processing electrode, and the second electrical lead of the voltage probe is coupled to an outer conductor of the transmission line.

3. The integrated voltage probe according to claim 2, wherein the first electrical lead of the voltage probe is coupled to the capacitively coupled plasma processing electrode, and the second electrical lead of the voltage probe is coupled to the inner conductor of the transmission line.

4. The integrated voltage probe according to claim 2, wherein the outer conductor of the transmission line comprises a grounding housing for the capacitively coupled plasma processing electrode.

5. The integrated voltage probe according to claim 1, wherein the capacitively coupled plasma processing electrode comprises an upper electrode.

6. The integrated voltage probe according to claim 1, wherein the capacitively coupled plasma processing electrode comprises a lower electrode.

7. The integrated voltage probe according to claim 1, further comprising a match network coupled to the transmission line between the capacitively coupled plasma processing electrode and the power supply.

8. An integrated current probe, for integration inside a transmission line between a capacitively coupled plasma processing electrode and a power source, the probe comprising:
   a current probe integrated into the transmission line;
   first and second electrical leads connected to the current probe; and
   a first window for passing the first and second electrical leads inside the transmission line to the current probe.

9. The integrated current probe according to claim 8, wherein the current probe comprises a loop antenna.

10. The integrated current probe according to claim 8, wherein the first electrical lead of the current probe is coupled to the loop antenna, and the second electrical lead of the current probe is coupled to an outer conductor of the transmission line.

11. The integrated current probe according to claim 8 further comprising a match network coupled to the transmission line between the capacitively coupled plasma processing electrode and the power supply.

12. The integrated current probe according to claim 8, wherein the capacitively coupled plasma processing electrode comprises an upper electrode.

13. The integrated current probe according to claim 8, wherein the capacitively coupled plasma processing electrode comprises an lower electrode.

14. An integrated voltage and current (VI) probe, for integration inside a transmission line between a capacitively coupled plasma processing electrode and a power source, the probe comprising:
   a voltage probe including (1) a voltage probe electrode integrated into the transmission line and (2) first and second electrical leads connected to the voltage probe electrode;
   a current probe including (1) a current probe integrated into the transmission line and (2) third and fourth electrical leads connected to the current probe; and
   a first window for passing (1) the first and second electrical leads inside the transmission line to the voltage probe electrode and (2) the third and fourth electrical leads inside the transmission line to the current probe.

15. The integrated VI probe according to claim 14, wherein the voltage and current probes are mounted on a single VI probe panel.

16. The integrated VI probe according to claim 14, further comprising a detector for detecting at least one of a voltage and a current transmitted through the transmission line.

17. An integrated voltage and current (VI) probe, for integration inside a transmission line between a capacitively coupled plasma processing electrode and a power source, the probe comprising:
   a voltage probe including (1) a voltage probe electrode integrated into the transmission line and (2) first and second electrical leads connected to the voltage probe electrode;
   a current probe including (1) a current probe integrated into the transmission line and (2) third and fourth electrical leads connected to the current probe;
   a first window for passing the first and second electrical leads inside the transmission line to the voltage probe electrode; and
   a second window for passing the third and fourth electrical leads inside the transmission line to the current probe.

18. The integrated VI probe according to claim 17, wherein the voltage and current probes are mounted to separate panels which are oriented on different sides of the transmission line.

19. The integrated VI probe according to claim 17, further comprising a detector for detecting at least one of a voltage and a current transmitted through the transmission line.

* * * * *